US008957696B2

(12) United States Patent
Von Staudt et al.

(10) Patent No.: US 8,957,696 B2
(45) Date of Patent: Feb. 17, 2015

(54) DRIVER CHIP BASED OLED MODULE CONNECTIVITY TEST

(75) Inventors: Hans Martin Von Staudt, Kingston Bagpuize (GB); Alan Somerville, Chippenham (GB); Matthew Green, Abingdon (GB); Shiho Hiroshima, Tokyo (JP)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 368 days.

(21) Appl. No.: 12/800,491

(22) Filed: May 17, 2010

(65) Prior Publication Data

US 2011/0279128 A1 Nov. 17, 2011

(30) Foreign Application Priority Data

May 12, 2010 (EP) .................................... 10368025

(51) Int. Cl.

*G01R 31/26* (2014.01)
*G09G 3/32* (2006.01)
*G09G 3/00* (2006.01)

(52) U.S. Cl.

CPC .............. *G09G 3/3216* (2013.01); *G09G 3/006* (2013.01); *G09G 3/3266* (2013.01); *G09G 3/3275* (2013.01); *G09G 2330/12* (2013.01)
USPC .................................................... 324/762.07

(58) Field of Classification Search

CPC ....................................................... G01R 31/26
USPC ........ 324/762.01–762.07; 345/60, 76, 80, 82, 345/100, 204, 205, 904
See application file for complete search history.

(56) References Cited

U.S. PATENT DOCUMENTS 5,977,776 A * 11/1999 Huth et al. .................... 324/537
6,734,636 B2 5/2004 Sanford et al.
6,859,052 B1 2/2005 Vaucher
6,946,307 B2 9/2005 Shih
6,965,361 B1 11/2005 Sheats et al.
7,091,738 B2 8/2006 Nakano et al.
7,116,295 B2 10/2006 Shih
7,122,970 B2 10/2006 Ono et al.
7,123,043 B2 10/2006 Tsai et al.

(Continued)

FOREIGN PATENT DOCUMENTS

EP 1 538 588 6/2005

OTHER PUBLICATIONS

"P-60: OLED Failure Analysis and Pinpoint Shot Repair of Fault using an Optical Coaxial System of High Sensitive CCD and a Laser," by Mitsutoshi Akatsu et al., SID Symposium Digest 37, 2006, pp. 426-428.
European Search Report. 10368025.2-2205 Mail date—Nov. 8, 2010, Dialog Semiconductor GmbH.

*Primary Examiner* — Arleen M Vazquez
*Assistant Examiner* — Feba Pothen
(74) *Attorney, Agent, or Firm* — Saile Ackerman LLC; Stephen B. Ackerman

(57) ABSTRACT

An anode driver chip and a cathode driver chip attached to an OLED device by means of anisotropic glue. The fine structure of the attachment means requires inspection to determine any resulting open and short conditions. The anode driver circuits comprise an output current detection that allows open circuit testing of the contact between the OLED device and the anode driver chip. The cathode driver circuits comprise a voltage detection circuit that allows both open and short circuit detection between cathode driver pads.

25 Claims, 3 Drawing Sheets

(56) References Cited

U.S. PATENT DOCUMENTS

| | | | |
|---|---|---|---|
| 7,196,536 B2 | 3/2007 | Nystrom et al. | |
| 7,336,035 B2 | 2/2008 | Koyama | |
| 7,348,943 B2 | 3/2008 | Koyama | |
| 7,663,395 B2 | 2/2010 | Chang et al. | |
| 2005/0110719 A1* | 5/2005 | Satoh et al. | 345/76 |
| 2005/0200294 A1* | 9/2005 | Naugler et al. | 315/149 |
| 2007/0273290 A1* | 11/2007 | Ashdown et al. | 315/113 |

* cited by examiner

DRIVER CHIP BASED OLED MODULE CONNECTIVITY TEST

BACKGROUND OF THE INVENTION

1. Field of Invention

This invention relates to OLED displays and in particular to testing the integrity of the connection of driver circuits to the OLED 2. Description of Related Art One of the more difficult tasks in forming OLED (organic light emitting diode) display modules is the attachment of driver chips to the substrate, such as glass. The attachment process uses anisotropic glue, which is to provide contact between signal and power contacts. The major source of problems are with open contacts and shorts between adjacent contacts. The method of determining a good process has been by visual inspection either by the human eye or by image processing equipment, such as cameras. Visual inspection by a human eye is prone to error and provides limited data for yield improvement. Visual inspection with image processing equipment is expensive, complicated and difficult to reproduce.

U.S. Pat. No. 7,336,035 B2 (Koyama) is directed to a OLED light emitting device wherein a current mirror circuit is formed to control drive current and luminance. In U.S. Pat. No. 7,196,536 B2 (Nystrom et al.) a method and apparatus is directed to non-contact electrical probes using corona discharge for testing OLED panels. In U.S. Pat. No. 7,123,043 B2 (Ysai et al.) a method and apparatus is directed to testing a plurality of driver circuits of an AMOLED before OLED devices are implanted by using data lines, scan lines and the power line of the AMOLED. U.S. Pat. No. 7,122,970 B2 (Ono et al.) is directed to a method for testing an OLED substrate including a switching element connected to a signal line. In U.S. Pat. No. 7,116,295 B2 (Shih) a method and system is directed to testing a plurality of driver circuits of an AMOLED where the drivers are connected to the OLED after the OLED is formed and is connected to a test element to form a loop during testing and wherein the drivers are tested one at a time. U.S. Pat. No. 7,091,738 B2 (Nakano et al.) is directed to an inspection system for inspecting characteristics of an active matrix panel before formation of an OLED, which includes a roller contact probe. U.S. Pat. No. 6,965,361 B1 (Sheats et al.) is directed to an OLED having a plurality of light emitting pixels, an isolation transistor and a driver circuit where connection points are bonded to corresponding second electrodes by a bonding layer.

In U.S. Pat. No. 6,946,307 B2 (Shih) a method and system is directed to testing circuits of an AMOLED before implantation of the OLED, wherein each circuit includes a connection to the OLED after the OLED is implanted and is configured as a test point. U.S. Pat. No. 6,859,052 B1 (Vaucher) is directed to the electrical test of electrical interconnections on a substrate by means of non-contact testing. U.S. Pat. No. 6,734,636 B2 (Sanford et al.) is directed to a method for driving an OLED comprising a first signal to set the state of a pixel circuit and a second signal to view the state. US Patent Application Publication US 2005/0078057 (Chang et al.) is directed to a display panel comprising a plurality of gate lines, data lines, switching elements, pixel electrodes, test pads, and a gate driver for generating gate signals to be applied to gate lines. In US Patent Application Publication US 2004/0239598 A1 (Koyama) a testing method is directed to active matrix display devices by checking a TFT substrate before depositing EL material and using a capacitor connected to a driver TFT in a pixel portion by visually observing the charging and discharging of the capacitor. In US Patent Application Publication US 2004/0201372 (Tsai et al) a method and apparatus is directed to testing the plurality of driver circuits of an AMOLED before the OLED is installed. In an article by Akatsu et al titled "OLED Failure Analysis and Pinpoint Shot Repair of Fault using an Optical Coaxial System of High Sensitive CCD and a Laser", by Mitsutoshi Akatsu, Naganori Tsutsui, Nobuthito Miura and Yoshihiro Miyazaki, SID Symposium Digest 37, 426 2006 discusses detecting and repair using an optical coaxial system.

SUMMARY OF THE INVENTION

It is an objective of the present invention to measure open and short circuits resulting from the attachment of anode driver and cathode driver chips to an OLED (organic light emitting diode) device.

It is further an objective of the present invention to integrate a current detection circuit with each anode driver circuit to allow detection of open circuits involving the connection of an anode driver chip and the cathode driver chip to the OLED device.

It is still further an objective of the present invention to detect short circuits between anode driver chip pads using the integrated current detection circuit coupled to each anode driver circuit.

It is also further an objective of the present invention to detect short circuits between cathode driver chip pads using a voltage detection circuit integrated with each cathode driver circuit.

In the present invention anode and cathode driver chips are attached to an OLED device using an electrical conducting attachment medium such as anisotropic glue. The large number of circuit pads, greater than one thousand, space by approximately 26 um with a gap separating circuit pads of less than approximately 13 um, which provides many opportunities for both open circuit and short circuit conditions to exist between the glass substrate OLED device and the anode driver and cathode driver chips. The circuitry and methods of the present invention provides capability to automatically check for open and short circuits during assembly of the display module production within which the OLED device is an integral part.

A current detection circuit integrated with each anode driver detects an open contact between the OLED device and the anode driver chip. The anode open test is performed with cathode driver circuits set to a low voltage state. Whereas the anode open circuit test can be made by measuring anode current, a voltage measurement of the anode pad to which the anode driver is connected can be used to determine proper current flow and therefore contact between the OLED device and the anode driver chip. Cathode driver chip open circuits formed when attaching the cathode driver chips to the OLED device is tested by setting one, or all, anode driver circuits to an on state. All cathode driver circuits are set to the off (HiZ) state, only the cathode pulldowns are set to an on state. If a cathode voltage is not detected, there is a cathode driver open and the product is rejected. Short circuits between anode driver chip pads are detected by setting all cathode driver circuits to a high impedance off state (HiZ), turning on the current drive for each anode driver circuit, in turn, with all other anode driver circuits in a low voltage state and detecting current of the anode circuit that is turned on.

Short circuits between cathode driver chip pads are tested by setting all anode driver circuits off (high impedance) and setting the pulldown of the cathode driver circuits on. Then all cathode driver circuits are first set low voltage on and then low voltage off to address capacitive load of the OLED array. Next each cathode driver circuit is set to high voltage on. Then if no cathode driver circuit detects a voltage, excluding the cathode driver circuit that is set to a high voltage on state, the particular cathode driver circuit is not shorted to any adjacent cathode driver circuits. If a voltage is detected in adjacent or neighboring cathode driver circuits, a short circuit exist between cathode driver circuits resulting from the attachment of the cathode driver chip to the OLED device.

It should be noted that the circuitry and techniques used to detect open and short circuits at the joining of electrical pads of driver chips and an OLED device can also be used to detect and diagnose failing pixels (open faults) within the OLED device.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
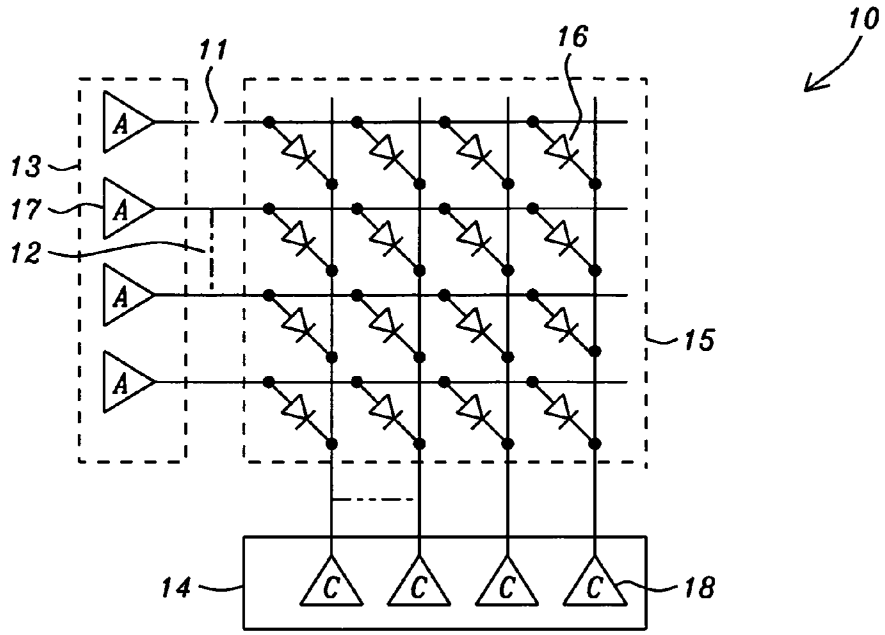
FIG. 1 is a circuit diagram of an OLED device of the present invention.

In FIG. 1 is shown a portion of an OLED device 10 with open 11 and short 12 conditions caused during the joining of driver chips 13 14 to an OLED substrate 15. The OLED substrate, a glass substrate, comprises a matrix of organic light emitting diodes 16, where the diodes 16 are driven by anode driver circuits 17 contained on a anode driver chip 13 and cathode driver circuits 18 contained on an anode driver chip 14. I/O pads on the OLED substrate 15 are physically and electrically connected to the I/O pads on the anode driver and cathode driver chips 13 14 by means of an electrical conducting attachment medium, for instance anisotropic glue.

There are over 1000 small, closely spaced contact pads on the OLED substrate that must be physically electrically connected to the anode and cathode driver chips. The fine structure of the closely spaced contact pads provide opportunity for both short circuits between contact pads and open circuits between the joined driver chips 13 14 to the contact pads of the OLED substrate 15. These open and short circuits can be detected by visual observation of various images that allow recognition of open faults (row or column stays dark) and short faults (row or column emits light together with neighbor instead of staying dark). This is a time consuming inspection with opportunity to miss a defect. The electrical techniques of the present invention allow an automatic and thorough detection of the integrity of the electrical connection of the driver chips to the OLED substrate.

Figure 2:
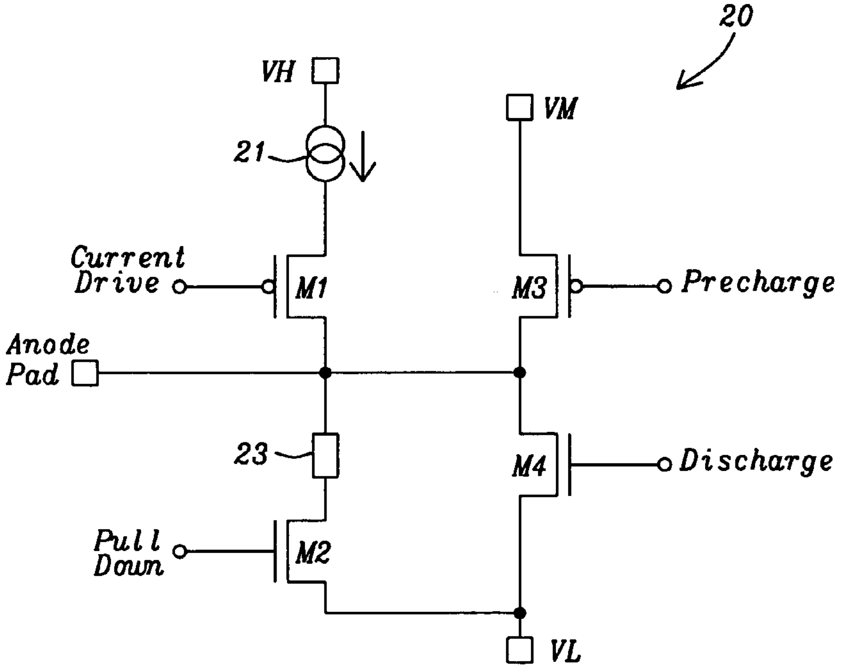
FIG. 2 is a circuit diagram of an anode driver circuit of the present invention.

The circuit of FIG. 2 demonstrates a typical anode driver circuit 20. Connected between a high voltage VH and a low voltage VL is a current source 21, a current drive transistor M1, a buffer resistor 23 and a pulldown transistor M2. An anode pad is connected to the current drive transistor M1 and the buffer resistor connected pulldown transistor M2. Also connected to the anode pad are a precharge transistor M3 and a discharge transistor M4. The precharge transistor M3 and the discharge transistor M4 are connected in series between a medium voltage VM and the low voltage VL.

The precharge transistor M3 and the discharge transistor M4 provide a means of charging and discharging, respectively, the capacitive loaded OLED anode lines of the OLED device in preparation for the next operation of the OLED device 10. The current drive transistor M1 gates the current source 21 to the anode pad and therefore, to a row of OLED devices. During the connection of the current source 21 to the anode pad the pulldown transistor M2, The precharge transistor M3 and the discharge transistor M4 are controlled off. The pulldown transistor M2 connects the anode pad to the low voltage VL. The pull down function is required to insure a discharge state of the OLED array and to suppress unwanted visual effects during power-up transition. The gate drive for M2 is the digital supply (always available) whereas M4 is driven from VH.

Figure 3A:
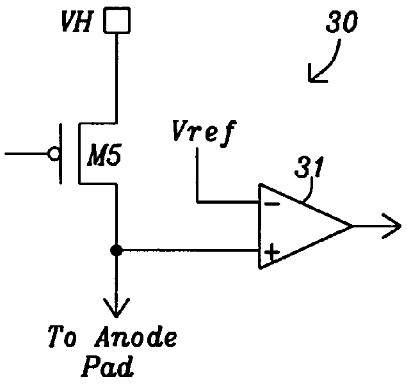
FIG. 3A is a circuit diagram of current detection using a voltage detection circuit integrated with the anode driver circuit of the present invention.

Shown in FIG. 3A is a voltage detection circuit that determines whether sufficient current is flowing through the constant current source 21 of the anode driver circuit 20 of the present invention; thereby indicating that there is a connection between the anode driver pad and either the anode of the OLED or to a neighbor anode driver pad. Whereas, current detection by circuitry comprising a current mirror or other techniques could be used, the use of a voltage detection circuit that detects the operating characteristics of the transistor M5, which forms a part of the current source 21, is an embodiment of the present invention.

Figure 3B:
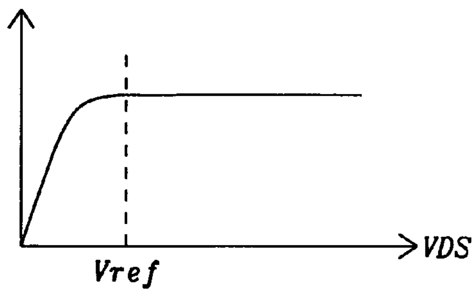
FIG. 3B is a graph relating anode driver current and voltage of the present invention.

FIG. 3B is a graph of the source to drain current of the constant current transistor M5 versus the source to drain voltage. When VDS is smaller than Vref the current source is not operating as a current source and an open circuit, or a resistive contact, exists. When VDS is higher than Vref, the current source represented by M5 is operating properly, indicating a current bearing connection, which is either the absence of an open defect or the presence of a short defect.

The addition of current detection to the anode driver circuit provides the capability to determine an open circuit in the connection of the anode and cathode driver circuits to the OLED device and is used to determine an anode short circuit to a neighboring anode pad during and after assembly of the OLED device to the anode and cathode driver devices.

Figure 4:
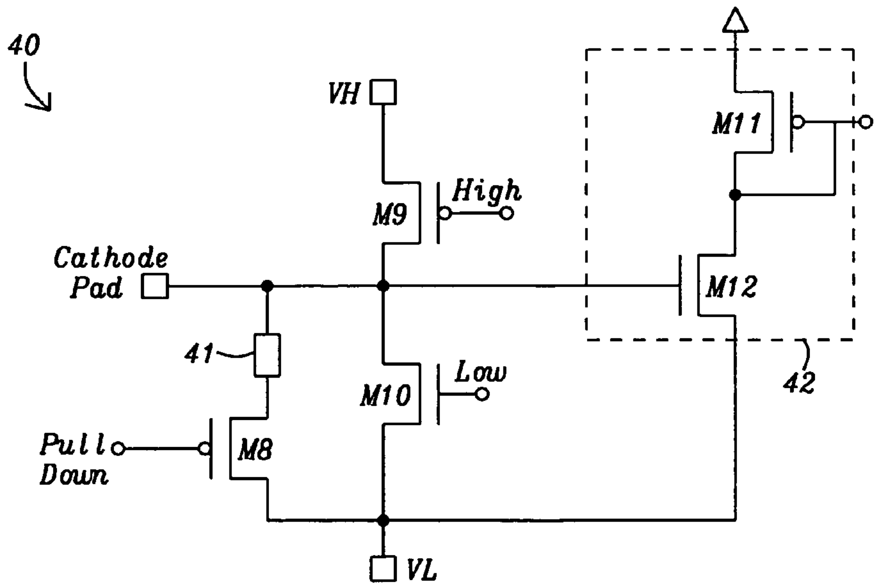
FIG. 4 is a circuit diagram of the cathode driver circuit of the present invention.

FIG. 4 shows a circuit diagram of the cathode driver circuit 40 of the present invention. Connected to the cathode pad of a cathode driver chip are transistors M9 and M10 that gate a high voltage VH or a low voltage VL to the cathode pad. Also connected to the cathode pad is a pulldown transistor M8 buffered from the cathode pad using a buffer resistor 41. The pulldown function is required to ensure a discharged state of the OLED array even in the case of a not yet powered up high voltage supply (VH). It also suppresses any unwanted visual effects during the power-up transition. The gate drive for M8 is the digital supply (always available) whereas M10 is driven from VH. Voltage detection circuit 42 comprising transistors M11 and M12 is connected to the cathode pad giving the cathode driver circuit the capability to measure cathode pad voltage. This capability allows a method to detect coupling to other cathode pads (presence of short faults) or to the OLED device (absence of open faults) before and after assembly of the OLED to the cathode driver devices.

Figure 5:
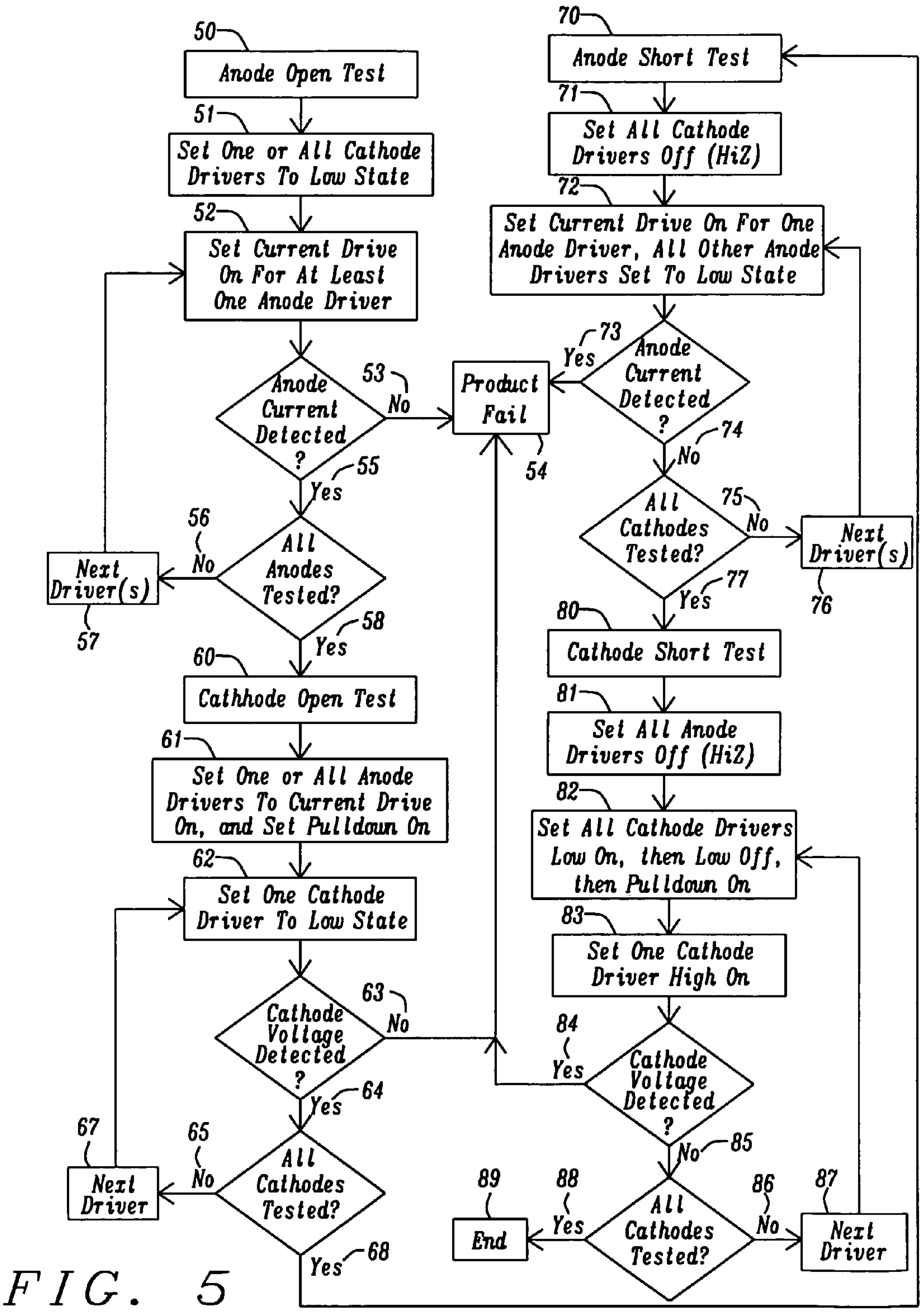
FIG. 5 is a diagram of the method of the present invention to detect open and short circuits at the attachment of device drivers to an OLED device.

FIG. 5 shows the method of the present invention for detecting open and short circuits associated with physically and electrically connecting anode driver chips and cathode driver chips to the OLED substrate. In an anode open test 50, one or all cathode driver circuits are set to a low voltage state 51 and the current drive for at least one anode driver circuit is turned on 52. If anode current is not detected 53, an open circuit is detected and the product fails 54. If current is detected and all anode driver circuits are not tested 56, then index to the next driver circuit 57 return to setting current drive on 52 and continue until all driver circuits and the connection through a contact pad to the OLED array are tested. If all anode driver circuits are tested 58, then proceed to the next series of tests.

Continuing to reference FIG. 5, in the open cathode circuit test 60, one or all anode driver circuits are set to current on and the pulldown device in the cathode driver circuits are set to the on state 61. Select at least one cathode voltage sensor 62. If cathode voltage is not detected 63, an open circuit exists in the cathode drive circuit connected to the OLED device and the product fails 54. If cathode voltage is detected and all cathode driver circuits are not tested 65, then the next cathode driver is selected 67 and set to a low voltage state. If all cathode circuits have been tested 68 for open circuit in the connection to the OLED device, then proceed to the next series of tests.

Continuing to reference FIG. 5, in the anode short circuit test 70, short circuits between closely spaced neighboring anode driver pads are tested. All cathode driver circuits are turned off (HiZ) 71 placing the cathode driver circuits into a high impedance state. Setting current drive on for one anode driver circuit where all other anode driver circuits are set to a low voltage state 72. If current is detected in the anode driver that is set with current on 73, then the product fails 54 and a short exists between anode driver pads. If anode current is not detected and all anode drivers are not tested 75, index to the next anode driver circuit 76 and set that next anode driver circuit to current on with the remaining anode driver circuit in a low voltage state. If all anode driver circuits have been tested 77 for short circuits between driver pads, then proceed to the next series of tests.

Continuing to reference FIG. 5, in the cathode driver short circuit test 80, the possibility of short circuits between cathode driver circuit pads are tested. All anode driver circuits are turned off (HiZ) 81 placing them into a high impedance state. Then all cathode drivers are set with the pulldown circuit on 82, but before proceeding, the cathode driver circuits are set to low voltage on and then low voltage off to discharge the cathode driver lines on the OLED array. One cathode driver is set to high voltage on 83 wherein all remaining cathode driver circuits set with the pulldown circuit on. If a cathode voltage is detected 84 on any of the other cathode driver circuits other than the one that is set with high voltage on, the product fails 54. If no cathode voltage is detected 85 and all cathode driver circuits are not tested 86, then set another one of the cathode driver circuits 87 is set to a high voltage on 83, wherein all remaining cathode driver circuits are set to pulldown on 82. If all cathode driver circuits have been tested 88, end the test procedure is ended 89 for testing the electrical integrity of connecting driver chips to an OLED substrate.

It should be noted that although the present invention as described herein uses a constant current source in the anode circuit and a voltage source in the cathode circuit, it is within the scope of the present invention that the constant current source can be an integral part of the cathode driver circuitry with the voltage source being an integral part of the anode circuitry, wherein current detection is used to detect open and shorted contacts between pads joining the OLED and the cathode driver device, and wherein voltage detection is used to detect open and shorted contacts between pads joining the OLED and the anode driver device. Further, implementation of a design that integrates a current source into the cathode driver circuits and a voltage source into the anode driver circuits may be similar to the circuitry shown herein, or different, while allowing similar, or different, techniques to provide capability to detect open and short circuit conditions associated with the joining cathode drive devices and anode driver devices to an OLED device, or similar display devices, wherein the fine stricture of the contact pads and the method of attachment provide opportunities for open and short conditions during manufacture and thereafter.

While the invention has been particularly shown and described with reference to preferred embodiments thereof, it will be understood by those skilled in the art that various changes in form and details may be made without departing from the spirit and scope of the invention.

What is claimed is:

1. A method to determine integrity of a connection of driver circuits to an OLED (organic light emitting diode) array, comprising:

a) forming a first driver device populated with a plurality of first driver type circuits, or forming the first driver device populated with a plurality of second driver type circuits;

b) forming a second driver device populated with a plurality of second driver type circuits, or forming the second driver device populated with a plurality of first driver type circuits;

c) attaching said first and said second driver devices to an OLED device;

d) testing for open circuits between connection pads of the OLED device and the first and second driver devices, further comprising:

i) detecting an open condition in a connection pad between said first driver type circuit and the OLED device by absence of first driver type circuit current measured by a current detecting circuit integrated with each first driver type circuit when the first driver type circuits populate said first driver device, or by absence of second driver type circuit voltage measured by a voltage detection circuit integrated into each second drive type circuit when the second driver type circuits populate said first driver device; and ii) detecting said open condition in the connection pad between said second driver type circuit and the OLED device by an absence of second driver type circuit voltage measured by a voltage sensor circuit integrated with each second driver type circuit, wherein a second driver type circuit pull down set to an "on" state when the second driver type circuits populate said second driver device, or by absence of first driver type circuit current measured by a current detecting circuit integrated into each first type driver circuit when the first driver type circuits populate said second driver device;

e) testing for short circuits between connection pads joining the OLED device and the first and second driver devices, further comprising:

i) detecting current flow in a selected first driver type circuit using a current detection circuit integrated into the first driver type circuit, wherein all second driver type circuits set to an "off" (HiZ) state and unselected first driver type circuits set to a low state; and ii) detecting a voltage in a selected second driver type circuit set to a "high on" state using a voltage sensor circuit integrated into the second driver type circuit, wherein all first driver type circuits set to said "off" (HiZ) state and all unselected second driver type circuits set to a "pull down on" state;

f) detecting open circuits in connection pads and detecting short circuits between connection pads by interchanging, which driver type circuit uses voltage detection and which driver type circuit uses current detection, wherein the current detecting circuit integrated in each first driver type circuit is interchanged with the voltage sensor circuit integrated with each second driver type circuit.

2. The method of claim 1, wherein testing for open circuits in the connection of pads between the OLED array and the first driver device, further comprises:

a) setting at least one second driver type circuit in said low state;

b) setting current drive to said "on" state for at least one first driver type circuit;

c) detecting an absence of said one first driver type circuit current to detect an open in the anode driver circuit connection pad; and d) repeating for each first driver type circuit.

3. The method of claim 2, wherein said first driver type circuit current is detected by measuring source to drain voltage of a current source transistor in the first driver type circuit.

4. The method of claim 1, wherein testing for open circuits in the connection pads between the OLED array and the second driver device, further comprises:

a) setting at least one first driver type circuit to a current drive "on" state;

b) selecting a voltage sensor in at least one second driver type circuit;

c) determining said open condition in the connection between the second driver type circuit pad and the OLED device by absence of second driver type circuit voltage; and d) repeating for each second driver type circuit.

5. The method of claim 4, wherein testing for open circuits in the connection pads between the OLED array and the second driver device, further comprises setting the second driver type circuit pull down to the "on" state.

6. The method of claim 1, wherein testing for short circuits between connection pads joining the OLED device and the first driver device, further comprises:

a) setting all second driver type circuits "off" to a high impedance state;

b) setting current drive to an on state for one first driver type circuit;

c) setting all other first driver type circuits to a low voltage state;

d) detecting current of said one first driver type circuit current to determine short circuit between connection pads of said one first driver type circuit and neighboring driver circuits; and e) repeating until all first driver type circuits are designated as said one first driver type circuit.

7. The method of claim 1, wherein testing short circuits between connection pads joining the OLED device and the second driver device, further comprises:

a) setting all first driver type circuits to a high impedance state "off" state;

b) setting one second driver type circuit to a "high on" state;

c) detecting second driver type circuit voltage to determine short circuit between the connection pads of said one second driver type circuit and neighboring driver circuits; and d) repeating step b) and c) until all second driver type circuits designated as said one second driver type circuit.

8. The method of claim 7, wherein testing short circuits between connection pads joining the OLED device and the second driver device, further comprises neutralizing the charge in the second driver type lines of the OLED array by turning a low voltage gate to an on state and then to an off state in each second driver type circuit.

9. The method of claim 7, wherein testing short circuits between connection pads joining the OLED device and the second driver device, further comprises setting pull down to an on state in all second driver type circuits.

10. The method of claim 1, wherein said first driver type circuit is an anode driver circuit and said second driver type circuit is a cathode driver circuit, or alternately, said first driver type circuit is a cathode driver circuit and said second driver type circuit is an anode driver circuit.

11. An open and short circuit connection detection system, comprising:

a) an OLED (organic light emitting diode) device;

b) a first driver circuit;

c) a second driver circuit;

d) a first driver chip comprising a plurality of first driver circuits, wherein said first driver chip connected to said OLED device using an electrical conducting attachment medium;

e) a second driver chip comprising a plurality of second driver circuits, wherein said second driver chip connected to said OLED device using said electrical conducting attachment medium;

f) said first driver circuit further comprising a current detection first circuit integrated into the first driver circuit to detect current flowing through the first driver circuit output pad, or said first driver circuit further comprising a voltage detector circuit integrated into the first driver circuit to detect voltage at the second driver circuit output pad;

g) said second driver circuit further comprising the voltage detector circuit integrated into the second driver circuit to detect voltage at the second driver circuit output pad, or said second driver circuit further comprising the current detection circuit integrated into the second driver circuit to detect current flowing through the first driver circuit output pad;

h) said current detection circuit used to detect open circuit connections between driver circuit output pad and said OLED device, and to detect a short circuit condition between driver circuit output pads comprising the current detection circuit, wherein all but one driver circuit comprising the current detection circuit set to a low state;

i) said voltage detector used to detect a short circuit condition between driver circuit output pads comprising the voltage detector circuit, and to detect open circuit conditions between said driver circuit pad comprising the voltage detector circuit and said OLED device; and j) said open circuit in driver circuit output pads and short circuits between output pads are also detected by interchanging which driver circuit comprises the current detection circuit and which driver circuit comprises the voltage detection circuit, wherein the current detection circuit integrated into the first driver circuit is interchanged with the voltage detector circuit integrated into the second driver circuit.

12. The system of claim 11, wherein said first driver circuit is an anode driver circuit and said second driver circuit is a cathode driver circuit, or alternatively, said first driver circuit is the cathode driver circuit and said second driver circuit is the anode driver circuit.

13. The system of claim 11, wherein said open connection between the first driver circuit output pad and the OLED device is detected by an absence of current in said first driver circuit wherein at least one second driver circuit set to a low voltage state.

14. The system of claim 11, wherein said open connection between the second driver circuit pad and the OLED device is detected by activation of at least one first driver circuit and detection of second driver circuit voltage.

15. The system of claim 14, wherein said open connection between the second driver circuit pad and the OLED device further comprises a second driver circuit pulldown set to an on state.

16. The system of claim 11, wherein said short circuit condition between first driver circuit output pads is detected by current flow from one first driver circuit wherein all other first driver circuits set to a low voltage state and all second driver circuits are set to a high impedance off state.

17. The system of claim 11, wherein said short circuit condition between second driver circuit output pads is detected by sensing voltage in one second driver circuit, wherein all first driver circuits are set off in a high impedance state and an other second driver circuit set to high on state.

18. The system of claim 17, wherein said short circuit condition between second driver output pads is detected by sensing voltage in one second driver circuit, wherein said one second driver circuit is set with pulldown circuit in a low on state.

19. A detection system for open and short circuits in bonding pads between an OLED and first and second driver devices, comprising:

a) a means for detecting current flowing through a first type driver circuit output pad, wherein a current detection circuit is integrated into each first type driver circuit;

b) a means for detecting voltage at a second type driver circuit output pad, wherein a voltage detecting circuit is integrated into each second type driver circuit;

c) a means for determining a failed product by detecting an open circuit in the output pad or a short circuit between output pads of the first type driver circuit using said current detection circuit integrated into the first type driver circuit, wherein an absence of current flowing in an output pad signifies an open circuit, and current flowing between output pads signify a short circuit; and d) a means for determining said failed product by detecting said open circuit in the output pad or said short circuit between output pads of the second type driver circuit using said voltage detection circuit integrated into the second type driver circuit, wherein an absence of voltage from the first type driver circuit detected in the output pad signifies said open circuit, and detection of voltage between output pads of second type driver circuits signifies said short circuit between second type driver circuits; and e) a means for detecting said open circuit in the output pad and short circuits between output pads by interchanging which type driver circuit uses voltage detection and which type driver circuit uses current detection, wherein the first type driver circuit uses voltage detection to detect said open circuit in the output pad and said short circuit between output pads, and wherein the second type driver circuit uses current detection to detect open circuit in the output pad and said short circuit between output pads.

20. The system of claim 19, wherein the means for detecting said open circuit in the output pad of the first type driver circuit further comprises:

a) a means for setting at least one second type driver circuit into a low state; and b) a means for detecting an absence of current in said first type driver circuit.

21. The system of claim 19, wherein the means for detecting said short circuit between output pads of the first type driver circuit further comprises:

a) a means for setting all second type driver circuits into a high impedance state;

b) a means for setting one first type driver circuit into a current drive on state;

c) a means for setting remainder of first type driver circuits into a low state; and d) a means for detecting of current in said one first type driver circuit.

22. The system of claim 19, wherein the means for detecting said open circuit in the output pad of the second type driver circuit further comprises:

a) a means for setting at least one first type driver circuit into a current drive on state; and b) a means for selecting at least one second type driver circuit to detect second type driver circuit voltage.

23. The system of claim 19, wherein the means for detecting said short circuit in the output pad of the second type driver circuit further comprises:

a) a means for setting all first type driver circuits into a high impedance state;

b) a means for setting one second type driver circuit into a high on state; and c) a means for detecting second type driver circuit voltage.

24. The system of claim 19, wherein the first type driver circuit is an anode driver circuit contained on an anode driver device and the second type driver circuit is a cathode driver circuit contained on a cathode driver device.

25. The system of claim 19, wherein the first type driver circuit is a cathode driver circuit contained on a cathode driver device and the second type driver circuit is an anode driver circuit contained on an anode driver device.

* * * * *